United States Patent
Sun et al.

(10) Patent No.: US 12,490,444 B2
(45) Date of Patent: Dec. 2, 2025

(54) MATCHING UNIT CAPACITOR WITH MULTIPLE METAL LAYERS

(71) Applicant: QUALCOMM Incorporated, San Diego, CA (US)

(72) Inventors: Lei Sun, San Diego, CA (US); Aram Akhavan, San Diego, CA (US); Behnam Sedighi, La Jolla, CA (US); Tszwing Choi, San Diego, CA (US); Henry Lau, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 717 days.

(21) Appl. No.: 17/740,465

(22) Filed: May 10, 2022

(65) Prior Publication Data
US 2023/0370085 A1  Nov. 16, 2023

(51) Int. Cl.
*H10D 1/68* (2025.01)
*H01L 23/522* (2006.01)
*H03M 1/80* (2006.01)
*H01G 4/38* (2006.01)

(52) U.S. Cl.
CPC ......... *H10D 1/714* (2025.01); *H01L 23/5223* (2013.01); *H01L 23/5225* (2013.01); *H03M 1/802* (2013.01); *H10D 1/716* (2025.01); *H01G 4/38* (2013.01)

(58) Field of Classification Search
CPC . H01L 23/5223; H01L 23/5225; H10D 1/716; H10D 1/714; H03M 1/802; H01G 4/38
See application file for complete search history.

(56) References Cited

U.S. PATENT DOCUMENTS

| 5,583,359 A * | 12/1996 | Ng ................ H01L 23/5223 257/532 |
| 7,754,606 B2 | 7/2010 | Paul et al. |
| 9,224,685 B1 | 12/2015 | Ding et al. |

(Continued)

FOREIGN PATENT DOCUMENTS

| DE | 69621011 T2 | 2/2003 |
| EP | 3499567 A1 | 6/2019 |

OTHER PUBLICATIONS

Partial International Search Report—PCT/US2023/019288—ISA/EPO—Aug. 16, 2023.

(Continued)

*Primary Examiner* — Eliseo Ramos Feliciano
*Assistant Examiner* — Brad A Knudson
(74) *Attorney, Agent, or Firm* — Haynes and Boone LLP

(57) ABSTRACT

A capacitor device comprises a semiconductor substrate with multiple metal layers above the substrate. a first metal layer has a first plurality of bottom terminals elongated in a first direction, and a first plurality of top terminals, electrically coupled to each other, elongated in the first direction and interleaved with the first plurality of bottom terminals. A second metal layer between the semiconductor substrate and the first metal layer has a second plurality of bottom terminals elongated in the first direction, and a second plurality of top terminals, electrically coupled to each other and the first plurality of top terminals, elongated in the first direction and interleaved with the second plurality of bottom terminals.

14 Claims, 5 Drawing Sheets

(56) References Cited

U.S. PATENT DOCUMENTS

| | | | |
|---|---|---|---|
| 2007/0296059 A1 | 12/2007 | Okuda et al. | |
| 2010/0127347 A1 | 5/2010 | Quinn | |
| 2013/0063861 A1* | 3/2013 | Wu | H10D 1/714 |
| | | | 29/25.41 |
| 2013/0113077 A1 | 5/2013 | Woo et al. | |
| 2022/0123762 A1* | 4/2022 | Ma | H01L 23/5223 |
| 2023/0261038 A1* | 8/2023 | Huang | H10D 1/716 |
| | | | 257/534 |

OTHER PUBLICATIONS

International Search Report and Written Opinion—PCT/US2023/019288—ISA/EPO—Oct. 11, 2023.

* cited by examiner

MATCHING UNIT CAPACITOR WITH MULTIPLE METAL LAYERS

TECHNICAL FIELD

This application relates to semiconductor devices, systems, and methods, and more particularly to capacitor devices, systems, and methods.

INTRODUCTION

Capacitors are elements that are used extensively in semiconductor devices for storing an electrical charge. Parallel-plate capacitors may include two conductive plates separated by an insulator. For a parallel-plate capacitor, the capacitance, or amount of charge held by the capacitor per applied voltage, depends on a number of parameters such as the area of the plates, the distance between the plates, and the dielectric constant (also referred to as the "permittivity") of the insulator between the plates. Capacitors can be used in filters, power supplies, analog-to-digital converters, memory devices, control applications, and many other types of semiconductor devices.

In some semiconductor devices such as successive approximation register (SAR) analog to digital converters (ADC), a capacitor array is used. In such applications, good matching between the capacitors is desired to improve performance. Matching requirements may be hindered by unwanted parasitic capacitance and other inconsistencies. Additionally, in devices that require a large number of capacitors, the capacitors may use a substantial area of a semiconductor. Therefore, there exists a need for improved matching capacitor devices.

BRIEF SUMMARY OF SOME EXAMPLES

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

One aspect of the present disclosure includes a capacitor structure comprising a semiconductor substrate. The capacitor structure further includes a first metal layer above the semiconductor substrate, the first metal layer having a first plurality of bottom terminals elongated in a first direction, a first plurality of top terminals, electrically coupled to each other, elongated in the first direction and interleaved with the first plurality of bottom terminals. The capacitor structure further includes a second metal layer between the semiconductor substrate and the first metal layer, the second metal layer having a second plurality of bottom terminals elongated in the first direction, and a second plurality of top terminals, electrically coupled to each other and the first plurality of top terminals, elongated in the first direction and interleaved with the second plurality of bottom terminals.

Another aspect of the present disclosure includes an analog to digital converter (ADC) including: a comparator, a semiconductor substrate, and a plurality of unit capacitors electrically coupled to the comparator. The plurality of unit capacitors comprises a first metal layer above the semiconductor substrate, the first metal layer having a first plurality of bottom terminals elongated in a first direction, and a first plurality of top terminals, electrically coupled to each other, elongated in the first direction and interleaved with the first plurality of bottom terminals. The ADC further includes a second metal layer between the semiconductor substrate and the first metal layer, the second metal layer having a second plurality of bottom terminals elongated in the first direction, and a second plurality of top terminals, electrically coupled to each other and the first plurality of top terminals, elongated in the first direction and interleaved with the second plurality of bottom terminals.

Another aspect of the present disclosure includes a method for manufacturing a capacitor structure comprising forming a first metal layer above a semiconductor substrate, the first metal layer having a first plurality of bottom terminals elongated in a first direction, and a first plurality of top terminals, electrically coupled to each other, elongated in the first direction and interleaved with the first plurality of bottom terminals. The method further includes forming a second metal layer above the first metal layer, the second metal layer having a second plurality of bottom terminals elongated in the first direction, and a second plurality of top terminals, electrically coupled to each other and the first plurality of top terminals, elongated in the first direction and interleaved with the second plurality of bottom terminals.

Another aspect of the present disclosure includes a capacitor structure comprising a semiconductor substrate and a first metal layer above the semiconductor substrate, the first metal layer having a first plurality of bottom terminals elongated in a first direction. The capacitor structure further includes a second metal layer above the first metal layer, the second metal layer having a first plurality of top terminals elongated in the first direction and directly above the first plurality of bottom terminals, and a second plurality of bottom terminals elongated in the first direction, and interleaved with the first plurality of top terminals. The capacitor structure further includes a third metal layer above the second metal layer, the third metal layer having a second plurality of top terminals elongated in the first direction and directly above the first plurality of top terminals, and a third plurality of bottom terminals elongated in the first direction, and interleaved with the second plurality of top terminals. The capacitor structure further includes a fourth metal layer above the third metal layer, the fourth metal layer having a fourth plurality of bottom terminals elongated in the first direction and directly above the second plurality of top terminals, and a fifth metal layer above the fourth metal layer, the fifth metal layer having a third plurality of top terminals elongated in the first direction and directly above the fourth plurality of bottom terminals, a fifth plurality of bottom terminals elongated in the first direction, and interleaved with the third plurality of top terminals.

Other aspects, features, and embodiments will become apparent to those of ordinary skill in the art, upon reviewing the following description of specific, exemplary aspects in conjunction with the accompanying figures. While features may be discussed relative to certain aspects and figures below, all aspects can include one or more of the advantageous features discussed herein. In other words, while one or more aspects may be discussed as having certain advantageous features, one or more of such features may also be used in accordance with the various aspects discussed herein. In similar fashion, while exemplary aspects may be discussed below as device, system, or method aspects it should be understood that such exemplary aspects can be implemented in various devices, systems, and methods.

DETAILED DESCRIPTION

Figure 1:
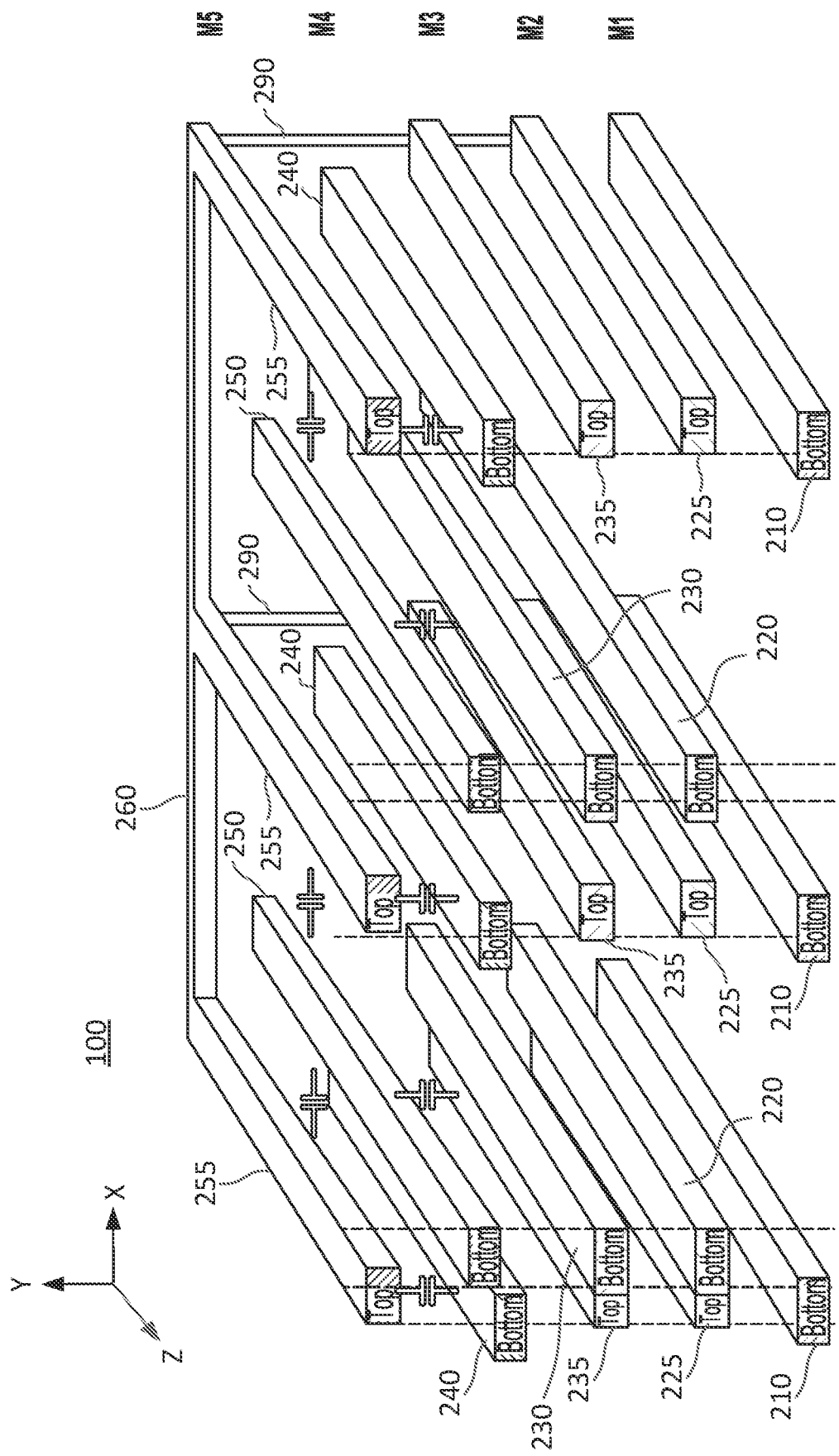
FIG. 1 is a perspective view of an exemplary capacitor structure, according to some aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some aspects, well-known structures and components are shown in block diagram form in order to avoid obscuring such concepts.

Various other aspects and features of the disclosure are further described below. It should be apparent that the teachings herein may be embodied in a wide variety of forms and that any specific structure, function, or both being disclosed herein is merely representative and not limiting. Based on the teachings herein one of an ordinary level of skill in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. For example, a method may be implemented as part of a system, device, apparatus, and/or as instructions stored on a computer readable medium for execution on a processor or computer. Furthermore, an aspect may comprise at least one element of a claim.

This disclosure relates generally to matching unit capacitors through the use of multiple metal layers. A closely matched pair or group of capacitors will have capacitance values that are very close, for example less than 1% of variation in capacitance. In various aspects, the techniques and apparatus may be used for successive approximation register analog to digital converters (SAR ADCs). For many SAR ADCs and other devices, an array of capacitors is used, and the performance of the device is dependent on the matching between the capacitors. For example, inconsistencies in parasitic capacitance between capacitors in an array may reduce the accuracy of an ADC.

Typical capacitor designs utilize only a single metal layer, with interleaved metal fingers in order to create a capacitor structure. Internal metal layers are filled with a pattern of floating (not electrically connected to either terminal of the capacitor) metal in order to maintain a flat structure. The absence of a metal fill pattern may cause the silicon device to warp or otherwise deform, causing issues including capacitor mismatch. However, the presence of the floating metal fill pattern also contributes to mismatch between capacitors, as parasitic capacitance between nodes of the capacitor device and the metal fill pattern may introduce inconsistencies across capacitors.

In order to mitigate these effects, rather than disconnected metal fill layers, internal metal layers may contain additional fingers which are electrically connected to nodes of a capacitor. Features of the internal fingers may include layers in which the fingers are elongated in a non-preferred direction based on the device structure or manufacturing process. The fingers elongated in a non-preferred direction (in this example, the Z-direction) may be wider than the fingers in other metal layers and have wider spacing between fingers. The wider spacing may require the fingers to only include one of the two nodes of the capacitor. Further, there is a possibility that parasitic capacitance to the semiconductor substrate may cause issues including capacitor mismatch. To mitigate this effect, the bottom metal layer, closest to the substrate, may only contain fingers for the "bottom" capacitor node which may be used to shield the "top" capacitor nodes on the next metal layer. The terms "top" and "bottom" are used in order to distinguish between the two terminals of the capacitor structures described herein. It should be understood that the labels "top" and "bottom", however, are interchangeable as they are applied to the terminals. For instance, referring to electrical terminals as "top" and "bottom" comes from years ago when capacitors were sheets of metal disposed on two different layers. In the physical structure as described in FIGS. 1-3, there is a terminal which is necessarily on the "bottom" of the structure (closest to the substrate). But the top part of the structure (farthest from the substrate) has connections to both "top" and "bottom" terminals. In other words, as applied to the terminals, "top" and "bottom" is not limited to a directional relationship; rather, it is a way to identify one capacitor terminal from the other.

One aspect of embodiments, as described in more detail below, is that the "bottom" terminal shields the "top" terminal from the substrate at the bottom of the structure, thereby reducing the parasitic of the "top" terminal to substrate by trading off (increasing) the parasitic of the "bottom" terminal to substrate. The architecture may also increase capacitor density.

Systems and methods described herein provide many advantages. Using internal metal layers allows for capacitor devices to take up less area of a semiconductor device, allowing for more capacitors in an array to fit in the same area. Further, the absence of floating metal fill pattern reduces parasitic capacitance, further improving capacitor matching. By shielding the "top" nodes from the substrate with an interposed "bottom" node, parasitic capacitance to the substrate may be mitigated, further improving capacitor matching and other performance metrics such as dynamic range. These benefits may allow for a device such as a SAR ADC to use a smaller footprint and/or produce more accurate measurements.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Figure 2:
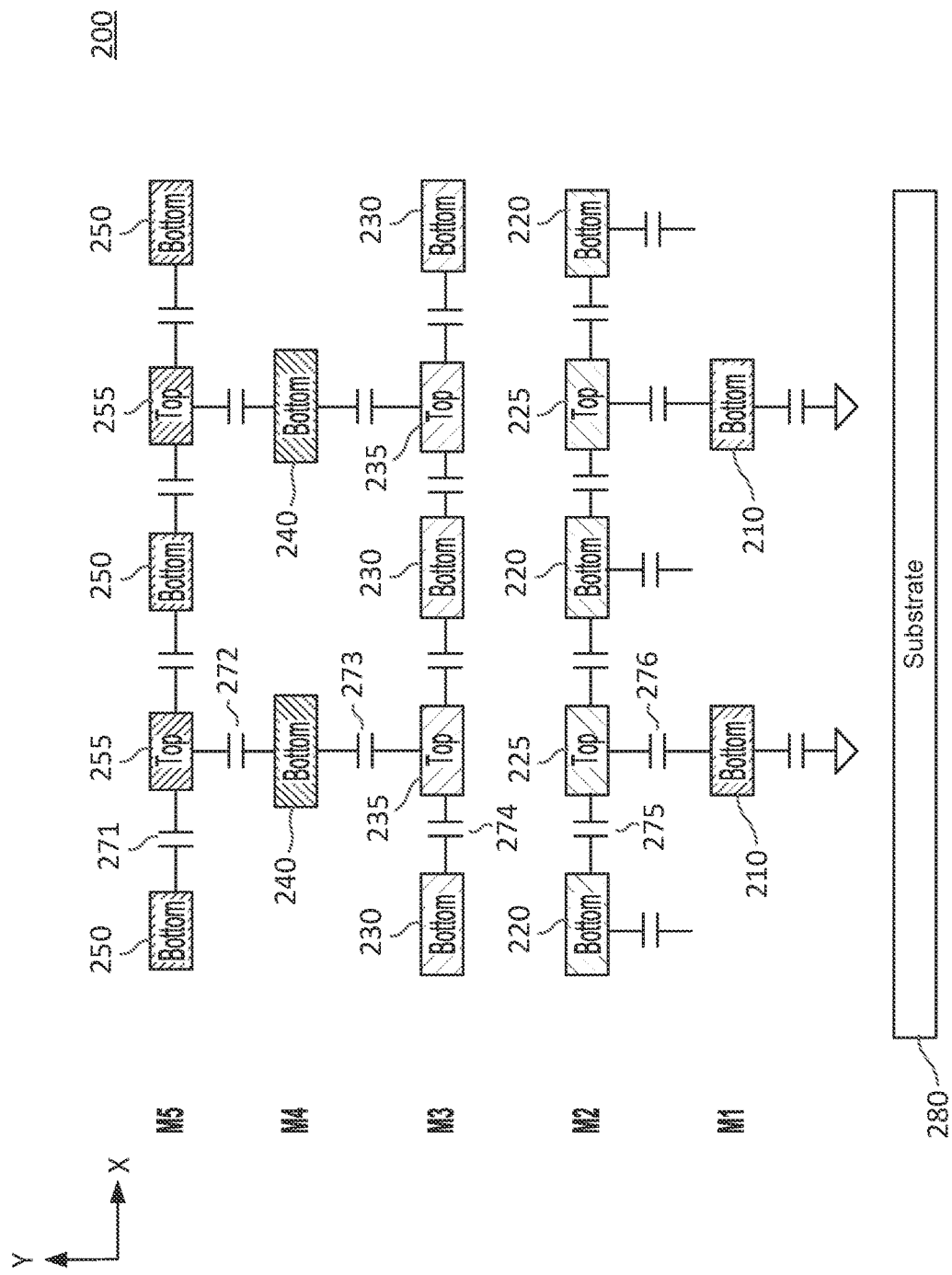
FIG. 2 is a cross-sectional view of an exemplary capacitor structure, according to some aspects of the present disclosure.
Figure 3:
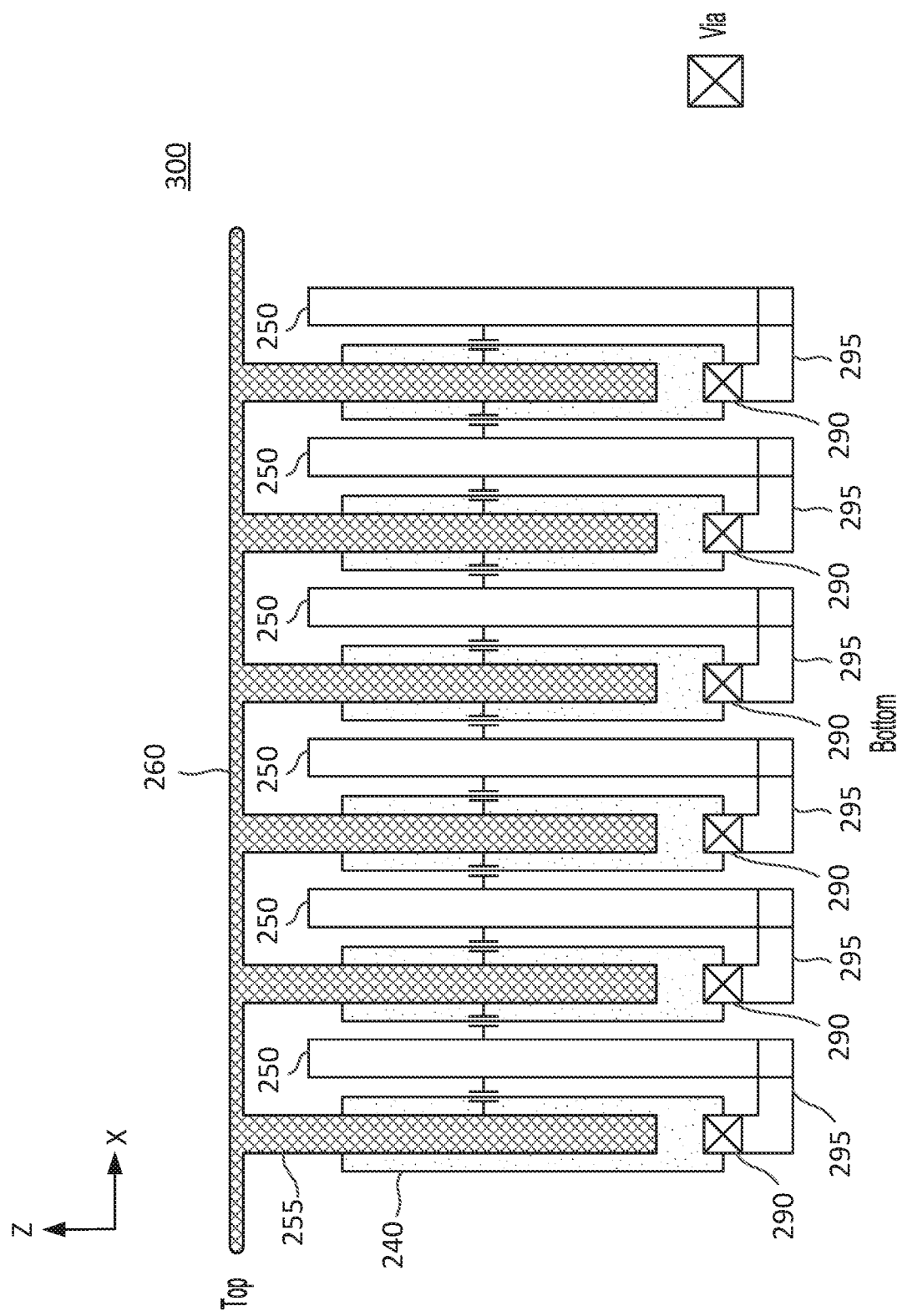
FIG. 3 is a top-down view of an exemplary capacitor structure, according to some aspects of the present disclosure.

FIG. 1 is a perspective view of an exemplary capacitor structure 100, according to some aspects of the present disclosure. Metal layers are identified as M1, M2, M3, M4, and M5, with M1 being the closest to the substrate (not illustrated). The metal layers themselves may be separated from each other and from the substrate with insulator material (also not illustrated). Capacitor symbols illustrate where there is significant capacitance between metal fingers. Capacitor nodes/terminals are labelled "Top" and "Bottom". In some aspects, the "Top" terminals are interconnected, and the "bottom" terminals are independently connected to the remaining circuit, although multiple bottom terminals may be connected to each other to form a larger capacitor. Top terminals may be interconnected by metal strips 260 extending in a second direction perpendicular to the fingers as illustrated, with connections to other metal layers achieved by vias 290 which may be placed at junction points as illustrated. The structure illustrated in FIG. 1 may be a repeating structure, of which only a portion is illustrated. FIGS. 2-3 illustrate substantially the same structure as FIG. 1, however from different perspectives, and illustrating different starting positions and number of repetitions of the repeating structure.

Layer M1 contains bottom terminal fingers 210 extending in a first direction (the Z-direction as illustrated). Layer M2 has bottom terminal fingers 220 interleaved with top terminal fingers 225. Top terminal fingers 225 are situated above bottom terminal fingers 210, so that the terminal fingers 225 are shielded from the substrate in order to minimize parasitic capacitance between the top terminal 225 and the substrate. Layer M3 contains bottom terminals 230 interleaved with top terminals 235, arranged in substantially the same was as layer M2.

Layer M4 contains bottom terminal fingers 240. In some aspects, bottom terminal fingers 240 extend in the first direction (the Z-direction as illustrated) which for layer M4 is a non-preferred direction. In this example, non-preferred versus preferred may be defined by the foundry. For instance, the foundry may specify that metal structures in layer M5 and layer M4 should be perpendicular, so that if layer M5 has metal structures with a dominant Z-direction axis, then M4 should have a dominant Y-direction axis. In this case, the metal in layers M4 and M5 are both laid out in the Z-direction, which would violate such a rule.

The example of FIG. 2 attempts to mitigate the rule violation by making bottom terminal fingers 240 wider than the metal fingers on other metal layers. Additionally, the spacing between metal fingers may be larger on layer M4 when using the non-preferred direction. In order to provide adequate spacing, top terminal fingers may not be formed on layer M4, leaving only bottom terminal fingers 240 with sufficient space between them. Bottom terminal fingers 240 may be formed over top terminal fingers 235, allowing for capacitance between the terminals. Of course, the example given herein of the foundry rule for layers M4 and M5 is an example only, and it is understood that different foundry rules may apply to different layers, and should one of the layers other than M4 employ a non-preferred direction, then width and spacing of its metal structures may be adapted similar to that shown in FIGS. 2 and M4.

Layer M5 contains bottom terminal fingers 250 interleaved with top terminal fingers 255. Top terminal fingers 255 may be formed over bottom terminal fingers 240, allowing for capacitance between the terminals.

The capacitor structure illustrated in FIG. 1 is exemplary, and other similar capacitor structures may be realized. For example, semiconductor processes with more metal layers (e.g., 7 or 11 metal layers) may be used. Similar arrangements of top and bottom terminal fingers may be utilized across the metal layers to provide unit capacitors without the need for a floating metal fill pattern. Additionally, capacitors formed using other numbers of metal layers may have other or additional layers where the fingers are elongated in a non-preferred direction. In this case, multiple layers may be formed with larger spacing and larger finger widths on layers where fingers extend in the non-preferred direction.

FIG. 2 is a cross-sectional view of an exemplary capacitor structure 200, according to some aspects of the present disclosure. The capacitor structure is the same as in FIG. 1 but shows a different portion of the repeating structure, and is shown at a different perspective to make clear the arrangement of top and bottom terminal fingers. Additionally, substrate 280 is illustrated below the metal layers.

As illustrated, there is capacitance between the plurality of bottom terminal fingers and the plurality of top terminal fingers. In some aspects, bottom terminal fingers are interconnected at least in groups that include two vertical columns of fingers. For example, bottom terminal fingers 250, 230, and 220 in the first column, and bottom terminal fingers 240 and 210 in the second column may be interconnected by vias (shown in FIG. 3 as vias 290) and connecting metal, so that they together with proximate top terminal fingers 255, 235, and 225 form a capacitor. In this example, there are six main capacitances forming the capacitor. The first is capacitance 271 between bottom terminal finger 250 and top terminal finger 255, the second is capacitance 272 between bottom terminal finger 240 and top terminal finger 255, the third is capacitance 273 between bottom terminal finger 240 and top terminal finger 235, the fourth is capacitance 274 between bottom terminal finger 230 and top terminal finger 235, the fifth is capacitance 275 between bottom terminal finger 220 and top terminal finger 225, and the sixth is capacitance 276 between bottom terminal finger 210 and top terminal finger 225.

In some aspects, these six capacitances together form a single unit capacitor. Unit capacitors may be connected together to form larger capacitors. For example, capacitors that are two, four, eight, etc. unit capacitors in size may be formed. In application such as SAR DACs, such groups of unit capacitors may be utilized. In the illustrated example, each bottom terminal finger 250 is situated between two top terminal fingers 255. As such, unit capacitors as described above may come in pairs, where the minimum capacitor size is two-unit capacitors ($2\,C_u$). In some aspects, unit capacitor may also refer to a single pair of a top terminal finger and a bottom terminal finger.

FIG. 3 is a top-down view of an exemplary capacitor structure 300, according to some aspects of the present disclosure. The capacitor structure is the same as in FIGS. 1-2 but shows a different portion of the repeating structure, and is shown at a different perspective highlighting the elongated fingers. This perspective also illustrates vias 290 which connect bottom terminals across metal layers. A "jog" 295 in the metal layer connects bottom terminal finger 250 to via 290, allowing for those two vertical columns to be connected in order to form a unit capacitor as described above with reference to FIG. 1. Furthermore, the portions of metal layer M1 that include fingers 210 are obscured from view by fingers 240 in the top-down view of FIG. 3, though it is understood that fingers 210 are also coupled electrically to via 290. Therefore, the top terminal fingers are electrically coupled to each other by metal strips 260, and the bottom terminal fingers are electrically coupled to each other by via 290 and the jog 295.

The number of unit capacitors that may be formed using the capacitor structure 300 of FIG. 3 is variable. For instance, the left-most jog 295 may be left uncoupled to the other similar jogs 295, and those jogs 295 may also be uncoupled to each other. Therefore, the leftmost jog 295 itself provides a single unit capacitor. The leftmost jog 295 may be coupled to its adjacent neighbor jog 295, thereby providing two unit capacitors. The electric coupling may be further extended rightward so that three consecutive jogs 295 are coupled together from left to right, thereby providing three unit capacitors. The electric coupling may be extended rightward in this manner to increase the number of unit capacitors provided by the capacitor structure 300. A designer may select a number of unit capacitors that are appropriate for a given application.

Figure 4:
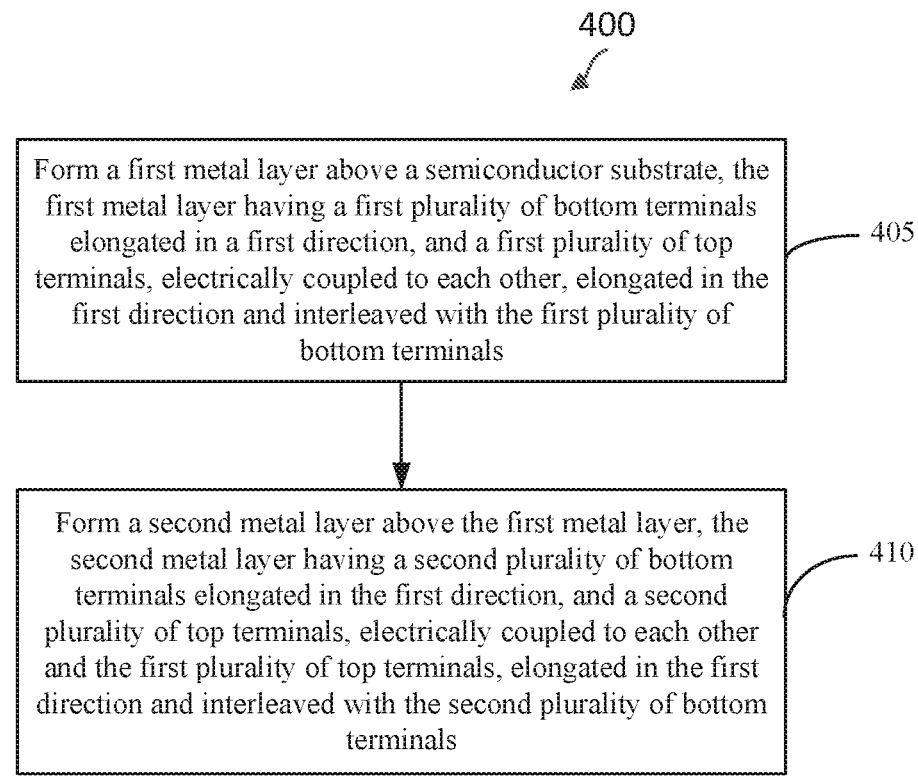
FIG. 4 is a flow chart illustrating an exemplary method for forming a capacitor structure, according to some aspects of the present disclosure.

FIG. 4 is a flow chart illustrating an exemplary method 400 for forming a capacitor structure, according to some aspects of the present disclosure. The structure may be, for example, capacitor structures 100-300 as described with reference to FIGS. 1-3. As illustrated, the method 400 includes a number of enumerated blocks, but aspects of the method 400 may include additional blocks before, after, and in between the enumerated blocks. In some aspects, one or more of the enumerated blocks may be omitted or performed in a different order.

At block 405, a first metal layer is formed above a semiconductor substrate (e.g., substrate 280 of FIG. 2), the first metal layer having a first plurality of bottom terminals elongated in a first direction, and a first plurality of top terminals, electrically coupled to each other, elongated in the first direction and interleaved with the first plurality of bottom terminals. For example, the first metal layer may be layer M3 of the capacitor structure described with reference to FIGS. 1-3.

Metal layer formation in FIG. 4 (in FIG. 5 as well) may include any appropriate semiconductor processing technique. For instance, layers of an insulator may be formed above the substrate. A given insulator layer may be patterned, and the process may further include depositing metal on the patterned insulator layer. The metal of the metal layers M1-M5 of FIG. 2 may be formed by deposition on a patterned insulator layer. Once the metal has been deposited, the process may further include disposing an additional insulator layer on top of the patterned insulator layer and metal layer. That additional insulator layer may then be patterned, and an additional metal layer may be deposited, and on and on as appropriate. As noted above, an example of the first metal layer may include M3, which is above M2 and below M4 and may be formed as described above. In the example of FIG. 2, layer M1 may be formed first, M2 may be formed second, then M3, then M4, then M5. Of course, the scope of implementations is not limited to any semiconductor processing technique.

At block 410, a second metal layer is formed above the first metal layer, the second metal layer having a second plurality of bottom terminals elongated in the first direction, and a second plurality of top terminals, electrically coupled to each other and the first plurality of top terminals, elongated in the first direction and interleaved with the second plurality of bottom terminals. For example, the second metal layer may be layer M5 of the capacitor structure described with reference to FIGS. 1-3.

Figure 5:
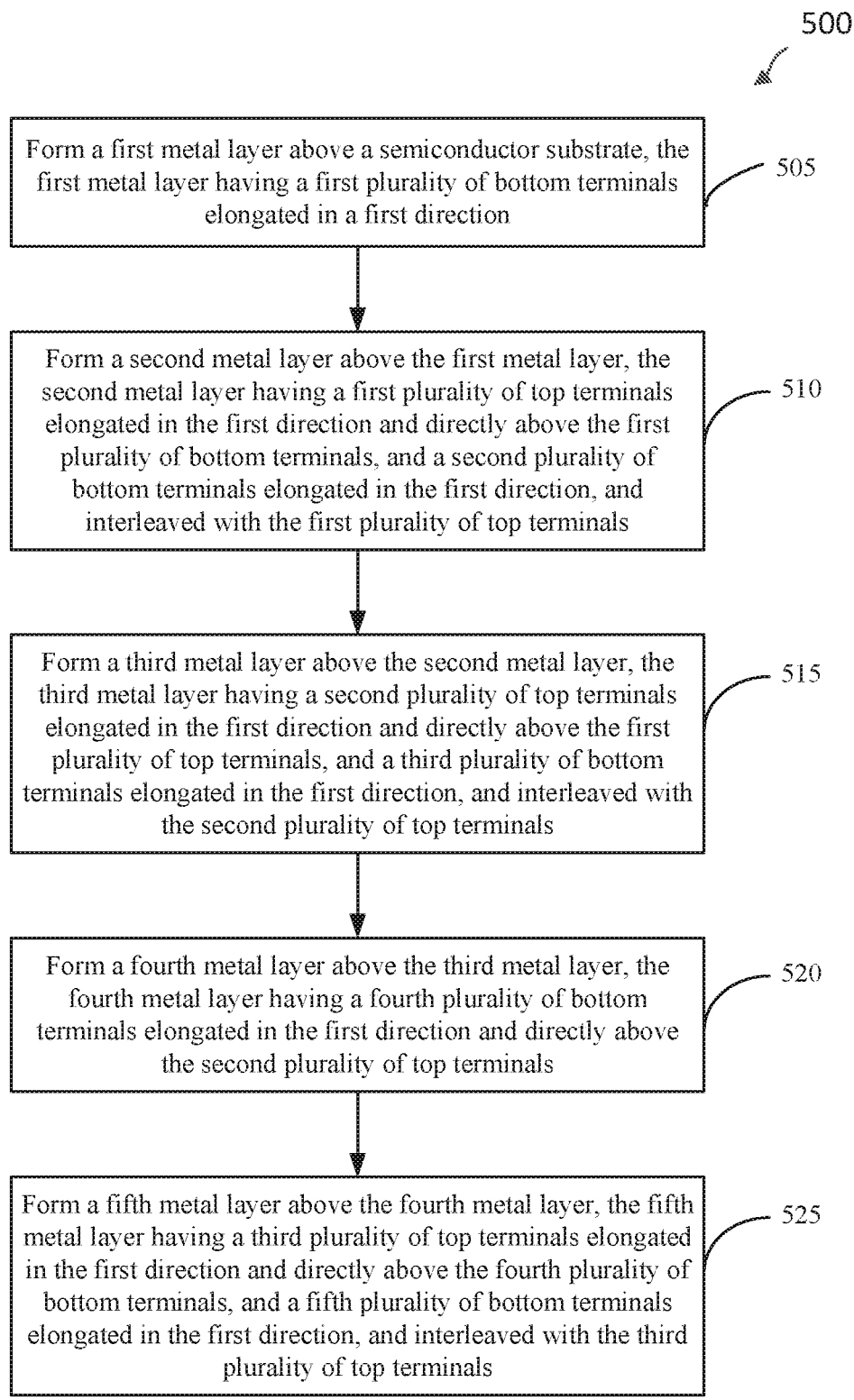
FIG. 5 is a flow chart illustrating an exemplary method for forming a capacitor structure, according to some aspects of the present disclosure.

FIG. 5 is a flow chart illustrating an exemplary method 500 for forming a capacitor structure, according to some aspects of the present disclosure. The structure may be, for example, capacitor structures 100-300 as described with reference to FIGS. 1-3. As illustrated, the method 500 includes a number of enumerated blocks, but aspects of the method 500 may include additional blocks before, after, and in between the enumerated blocks. In some aspects, one or more of the enumerated blocks may be omitted or performed in a different order.

At block 505, a first metal layer is formed above a semiconductor substrate, the first metal layer having a first plurality of bottom terminals elongated in a first direction. For example, the first metal layer may be layer M1 of the capacitor structure described with reference to FIGS. 1-3.

At block 510, a second metal layer is formed above the first metal layer, the second metal layer having a first plurality of top terminals elongated in the first direction and directly above the first plurality of bottom terminals, and a second plurality of bottom terminals elongated in the first direction, and interleaved with the first plurality of top terminals. For example, the second metal layer may be layer M2 of the capacitor structure described with reference to FIGS. 1-3. The first plurality of top terminals may be situated directly above the first plurality of bottom terminals so that the first plurality of bottom terminals shields the first plurality of top terminals from the substrate.

At block 515, a third metal layer is formed above the second metal layer, the third metal layer having a second plurality of top terminals elongated in the first direction and directly above the first plurality of top terminals, and a third plurality of bottom terminals elongated in the first direction, and interleaved with the second plurality of top terminals. For example, the third metal layer may be layer M3 of the capacitor structure described with reference to FIGS. 1-3.

At block 520, a fourth metal layer is formed above the third metal layer, the fourth metal layer having a fourth plurality of bottom terminals elongated in the first direction and directly above the second plurality of top terminals. For example, the fourth metal layer may be layer M4 of the capacitor structure described with reference to FIGS. 1-3. In some aspects, the first direction is a non-preferred direction on the fourth metal layer. The fourth plurality of bottom terminals may be formed wider in a second direction (the X-direction as illustrated in FIGS. 1-3) perpendicular to the first direction than fingers on other metal layers. Additionally, metal fingers may be spaced further apart on the fourth metal layer.

At block 525, a fifth metal layer is formed above the fourth metal layer, the fifth metal layer having a third plurality of top terminals elongated in the first direction and directly above the fourth plurality of bottom terminals, and a fifth plurality of bottom terminals elongated in the first direction, and interleaved with the third plurality of top terminals. For example, the fifth metal layer may be layer M5 of the capacitor structure described with reference to FIGS. 1-3.

As noted above, the capacitor structures described herein may be used with a variety of different circuits. For instance, the improved consistency and manufacturability of the capacitor structures may lead them to be adopted in some analog-to-digital converters (ADCs), among other circuits. An array of unit capacitors, for example, may be used to produce a voltage which is an input to a comparator of an ADC. The ADC comparator may compare the voltage produced using the array of unit capacitors to a voltage being measured. In one example, transistors may be formed in an active layer on the substrate (e.g., substrate 280 of FIG. 2), and those transistors may form logic and power circuitry for a given application (e.g., an ADC). The capacitor may couple to a transistor using vias or any other desirable technique. For instance, a via (not shown) may couple a source or drain of a first transistor in the active layer below M1 to a top finger in one of the metal layers (e.g., M2), and another via (not shown) may couple a source or drain of a second transistor in the active layer to a bottom finger in another one of the metal layers (e.g., M5). The transistors may then be turned on or off to direct current through the capacitor structure as appropriate. The scope of embodiments is not limited to use in an ADC nor in any particular device. For instance, the capacitor structures described herein may be used in user equipment (e.g., smart phones, tablets, Internet of things devices, and the like), in a telecommunications network base station, or any other appropriate device.

Further aspects of the present disclosure include the following:

Aspect 1. A capacitor structure comprising:
  a semiconductor substrate;
  a first metal layer above the semiconductor substrate, the first metal layer having:
    a first plurality of bottom terminals elongated in a first direction, and
    a first plurality of top terminals, electrically coupled to each other, elongated in the first direction and interleaved with the first plurality of bottom terminals; and
  a second metal layer between the semiconductor substrate and the first metal layer, the second metal layer having:
    a second plurality of bottom terminals elongated in the first direction, and
    a second plurality of top terminals, electrically coupled to each other and the first plurality of top terminals, elongated in the first direction and interleaved with the second plurality of bottom terminals.

Aspect 2. The capacitor structure of aspect 1, further comprising:
  a third metal layer between the first metal layer and the second metal layer having a third plurality of bottom terminals elongated in the first direction,
  wherein each one of the third plurality of bottom terminals is disposed between the semiconductor substrate and a respective terminal of the first plurality of top terminals, and
  wherein each one of the first plurality of bottom terminals has a first width in a second direction perpendicular to the first direction, each one of the third plurality of bottom terminals has a second width in the second direction, the second width being larger than the first width.

Aspect 3. The capacitor structure of aspect 2, wherein a first distance in the second direction between respective bottom terminals of the third plurality of bottom terminals is larger than a second distance in the second direction between top terminals of the first plurality of top terminals and bottom terminals of the first plurality of bottom terminals.

Aspect 4. The capacitor structure of any of aspects 1-3, wherein the first plurality of bottom terminals and the second plurality of bottom terminals are electrically coupled to form a plurality of groups of unit capacitors.

Aspect 5. The capacitor structure of aspect 4, further comprising a plurality of vias connecting the first plurality of bottom terminals to the second plurality of bottom terminals in the plurality of groups of unit capacitors.

Aspect 6. The capacitor structure of any of aspects 1-5, further comprising:
  a third metal layer disposed between the semiconductor substrate and the second metal layer, the third metal layer having:
    a third plurality of bottom terminals elongated in the first direction, and
    a third plurality of top terminals, electrically coupled to each other and the first plurality of top terminals, elongated in the first direction and interleaved with the third plurality of bottom terminals; and
  a fourth metal layer between the semiconductor substrate and the third metal layer, the fourth metal layer having:
    a fourth plurality of bottom terminals elongated in the first direction, each one of the fourth plurality of bottom terminals disposed between the semiconductor substrate and a respective one of the third plurality of top terminals.

Aspect 7. The capacitor structure of any of aspects 1-6, further comprising a plurality of vias connecting the first plurality of top terminals to the second plurality of top terminals.

Aspect 8. The capacitor structure of any of aspects 1-7, further comprising:
  a metal strip on the first metal layer elongated in a second direction perpendicular to the first direction,
    wherein the first plurality of top terminals are electrically coupled to each other by the metal strip.

Aspect 9. The capacitor structure of any of aspects 1-8, wherein a volume between the substrate and the first plurality of bottom terminals does not contain metal that is electrically floating.

Aspect 10. An analog to digital converter (ADC) comprising:
  a comparator;
  a semiconductor substrate; and
  a plurality of unit capacitors electrically coupled to the comparator, the plurality of unit capacitors comprising:
    a first metal layer above the semiconductor substrate, the first metal layer having:
      a first plurality of bottom terminals elongated in a first direction, and
      a first plurality of top terminals, electrically coupled to each other, elongated in the first direction and interleaved with the first plurality of bottom terminals; and
    a second metal layer between the semiconductor substrate and the first metal layer, the second metal layer having:
      a second plurality of bottom terminals elongated in the first direction, and a second plurality of top terminals, electrically coupled to each other and the first plurality of top terminals, elongated in the first direction and interleaved with the second plurality of bottom terminals.

Aspect 11. The ADC of aspect 10, wherein the plurality of unit capacitors further comprises:
a third metal layer between the first metal layer and the second metal layer having a third plurality of bottom terminals elongated in the first direction,
wherein each one of the third plurality of bottom terminals is disposed between the semiconductor substrate and a respective terminal of the first plurality of top terminals, and
wherein each one of the first plurality of bottom terminals has a first width in a second direction perpendicular to the first direction, each one of the third plurality of bottom terminals has a second width in the second direction, the second width being larger than the first width.

Aspect 12. The ADC of aspect 11, wherein a first distance in the second direction between respective bottom terminals of the third plurality of bottom terminals is larger than a second distance in the second direction between top terminals of the first plurality of top terminals and bottom terminals of the first plurality of bottom terminals.

Aspect 13. The ADC of any of aspects 10-12, wherein the first plurality of bottom terminals and the second plurality of bottom terminals are electrically coupled to form a plurality of groups of unit capacitors.

Aspect 14. The ADC of any of aspects 10-13, wherein the plurality of unit capacitors further comprises a plurality of vias connecting the first plurality of bottom terminals to the second plurality of bottom terminals.

Aspect 15. The ADC of any of aspects 10-14, wherein the plurality of unit capacitors further comprises:
a third metal layer disposed between the semiconductor substrate and the second metal layer, the third metal layer having:
a third plurality of bottom terminals elongated in the first direction, and
a third plurality of top terminals, electrically coupled to each other and the first plurality of top terminals, elongated in the first direction and interleaved with the third plurality of bottom terminals; and
a fourth metal layer between the semiconductor substrate and the third metal layer, the fourth metal layer having:
a fourth plurality of bottom terminals elongated in the first direction, each one of the fourth plurality of bottom terminals disposed between the semiconductor substrate and a respective one of the third plurality of top terminals.

Aspect 16. The ADC of any of aspects 10-15, wherein the plurality of unit capacitors further comprises a plurality of vias connecting the first plurality of top terminals to the second plurality of top terminals.

Aspect 17. The ADC of any of aspects 10-16, wherein the plurality of unit capacitors further comprises:
a metal strip on the first metal layer elongated in a second direction perpendicular to the first direction,
wherein the first plurality of top terminals are electrically coupled to each other by the metal strip.

Aspect 18. The ADC of any of aspects 10-17, wherein a volume between the substrate and the first plurality of bottom terminals does not contain metal that is electrically floating.

Aspect 19. A method for manufacturing a capacitor structure comprising:
forming a first metal layer above a semiconductor substrate, the first metal layer having:
a first plurality of bottom terminals elongated in the first direction, and
a first plurality of top terminals, electrically coupled to each other, elongated in the first direction and interleaved with the first plurality of bottom terminals; and
forming a second metal layer above the first metal layer, the second metal layer having:
a second plurality of bottom terminals elongated in the first direction, and
a second plurality of top terminals, electrically coupled to each other and the first plurality of top terminals, elongated in the first direction and interleaved with the second plurality of bottom terminals.

Aspect 20. The method of aspect 19, further comprising:
forming a third metal layer between the first metal layer and the second metal layer having a third plurality of bottom terminals elongated in the first direction,
wherein each one of the third plurality of bottom terminals is disposed between the semiconductor substrate and a respective terminal of the second plurality of top terminals, and
wherein each one of the second plurality of bottom terminals has a first width in a second direction perpendicular to the first direction, each one of the third plurality of bottom terminals has a second width in the second direction, the second width being larger than the first width.

Aspect 21. The method of aspect 20, wherein a first distance in the second direction between respective bottom terminals of the third plurality of bottom terminals is larger than a second distance in the second direction between top terminals of the second plurality of top terminals and bottom terminals of the first plurality of bottom terminals.

Aspect 22. The method of any of aspects 19-21, wherein the first plurality of bottom terminals and the second plurality of bottom terminals are electrically coupled to form a plurality of groups of unit capacitors.

Aspect 23. The method of aspect 22, further comprising:
forming a plurality of vias connecting the first plurality of bottom terminals to the second plurality of bottom terminals in the plurality of groups of unit capacitors.

Aspect 24. The method of any of aspects 19-23, further comprising:
forming a third metal layer disposed between the semiconductor substrate and the second metal layer, the third metal layer having:
a third plurality of bottom terminals elongated in the first direction, and
a third plurality of top terminals, electrically coupled to each other and the first plurality of top terminals, elongated in the first direction and interleaved with the third plurality of bottom terminals; and
forming a fourth metal layer between the semiconductor substrate and the third metal layer, the fourth metal layer having:
a fourth plurality of bottom terminals elongated in the first direction, each one of the fourth plurality of bottom terminals disposed between the semiconductor substrate and a respective one of the third plurality of top terminals.

Aspect 25. The method of any of aspects 19-24, further comprising:
forming a plurality of vias connecting the first plurality of top terminals to the second plurality of top terminals.

Aspect 26. The method of any of aspects 19-25, further comprising:
forming a metal strip on the second metal layer elongated in a second direction perpendicular to the first direction,
wherein the second plurality of top terminals are electrically coupled to each other by the metal strip.

Aspect 27. The method of any of aspects 19-26, wherein a volume between the substrate and the second plurality of bottom terminals does not contain metal that is electrically floating.

Aspect 28. A capacitor structure comprising:
a semiconductor substrate;
a first metal layer above the semiconductor substrate, the first metal layer having a first plurality of bottom terminals elongated in a first direction;
a second metal layer above the first metal layer, the second metal layer having:
a first plurality of top terminals elongated in the first direction and directly above the first plurality of bottom terminals, and
a second plurality of bottom terminals elongated in the first direction, and interleaved with the first plurality of top terminals;
a third metal layer above the second metal layer, the third metal layer having:
a second plurality of top terminals elongated in the first direction and directly above the first plurality of top terminals, and
a third plurality of bottom terminals elongated in the first direction, and interleaved with the second plurality of top terminals;
a fourth metal layer above the third metal layer, the fourth metal layer having:
a fourth plurality of bottom terminals elongated in the first direction and directly above the second plurality of top terminals; and
a fifth metal layer above the fourth metal layer, the fifth metal layer having:
a third plurality of top terminals elongated in the first direction and directly above the fourth plurality of bottom terminals, and
a fifth plurality of bottom terminals elongated in the first direction, and interleaved with the third plurality of top terminals.

The foregoing describes features of several aspects of the present disclosure. Those skilled in the art should realize that equivalent constructions do not depart from the spirit and scope of the present disclosure, and that they may make various changes, substitutions, and alterations herein without departing from the spirit and scope of the present disclosure. As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular aspects illustrated and described herein, as they are merely by way of some examples thereof, but rather, should be fully commensurate with that of the claims appended hereafter and their functional equivalents.

What is claimed is:

1. A capacitor structure comprising:
a semiconductor substrate;
a first metal layer above the semiconductor substrate, the first metal layer having:
a first plurality of bottom terminals elongated in a first direction, and
a first plurality of top terminals, electrically coupled to each other, elongated in the first direction and interleaved with the first plurality of bottom terminals;
a second metal layer between the semiconductor substrate and the first metal layer, the second metal layer having:
a second plurality of bottom terminals elongated in the first direction, and
a second plurality of top terminals, electrically coupled to each other and the first plurality of top terminals, elongated in the first direction and interleaved with the second plurality of bottom terminals; and
a third metal layer between the first metal layer and the second metal layer having a third plurality of bottom terminals elongated in the first direction,
wherein each one of the third plurality of bottom terminals is disposed between the semiconductor substrate and a respective terminal of the first plurality of top terminals, and
wherein each one of the first plurality of bottom terminals has a first width in a second direction perpendicular to the first direction, each one of the third plurality of bottom terminals has a second width in the second direction, the second width being larger than the first width.

2. The capacitor structure of claim 1, wherein a first distance in the second direction between respective bottom terminals of the third plurality of bottom terminals is larger than a second distance in the second direction between top terminals of the first plurality of top terminals and bottom terminals of the first plurality of bottom terminals.

3. The capacitor structure of claim 1, wherein the first plurality of bottom terminals and the second plurality of bottom terminals are electrically coupled to form a plurality of groups of unit capacitors.

4. The capacitor structure of claim 3, further comprising a plurality of vias connecting the first plurality of bottom terminals to the second plurality of bottom terminals in the plurality of groups of unit capacitors.

5. The capacitor structure of claim 1, further comprising a plurality of vias connecting the first plurality of top terminals to the second plurality of top terminals.

6. The capacitor structure of claim 1, further comprising:
a metal strip on the first metal layer elongated in a second direction perpendicular to the first direction,
wherein the first plurality of top terminals are electrically coupled to each other by the metal strip.

7. The capacitor structure of claim 1, wherein a volume between the substrate and the first plurality of bottom terminals does not contain metal that is electrically floating.

8. A method for manufacturing a capacitor structure comprising:
forming a first metal layer above a semiconductor substrate, the first metal layer having:
a first plurality of bottom terminals elongated in a first direction, and
a first plurality of top terminals, electrically coupled to each other, elongated in the first direction and interleaved with the first plurality of bottom terminals;

forming a second metal layer above the first metal layer, the second metal layer having:
  a second plurality of bottom terminals elongated in the first direction, and
  a second plurality of top terminals, electrically coupled to each other and the first plurality of top terminals, elongated in the first direction and interleaved with the second plurality of bottom terminals; and
forming a third metal layer between the first metal layer and the second metal layer having a third plurality of bottom terminals elongated in the first direction,
wherein each one of the third plurality of bottom terminals is disposed between the semiconductor substrate and a respective terminal of the second plurality of top terminals, and
wherein each one of the second plurality of bottom terminals has a first width in a second direction perpendicular to the first direction, each one of the third plurality of bottom terminals has a second width in the second direction, the second width being larger than the first width.

9. The method of claim 8, wherein a first distance in the second direction between respective bottom terminals of the third plurality of bottom terminals is larger than a second distance in the second direction between top terminals of the second plurality of top terminals and bottom terminals of the first plurality of bottom terminals.

10. The method of claim 8, wherein the first plurality of bottom terminals and the second plurality of bottom terminals are electrically coupled to form a plurality of groups of unit capacitors.

11. The method of claim 10, further comprising:
forming a plurality of vias connecting the first plurality of bottom terminals to the second plurality of bottom terminals in the plurality of groups of unit capacitors.

12. The method of claim 8, further comprising:
forming a plurality of vias connecting the first plurality of top terminals to the second plurality of top terminals.

13. The method of claim 8, further comprising:
forming a metal strip on the second metal layer elongated in a second direction perpendicular to the first direction,
wherein the second plurality of top terminals are electrically coupled to each other by the metal strip.

14. The method of claim 8, wherein a volume between the semiconductor substrate and the second plurality of bottom terminals does not contain metal that is electrically floating.

* * * * *